United States Patent [19]
Nevill

[11] Patent Number: 4,926,117
[45] Date of Patent: May 15, 1990

[54] BURN-IN BOARD HAVING DISCRETE TEST CAPABILITY

[75] Inventor: Leland R. Nevill, Boise, Id.

[73] Assignee: Micron Technology, Inc., Boise, Id.

[21] Appl. No.: 189,413

[22] Filed: May 2, 1988

[51] Int. Cl.$^5$ .................... G01R 31/02; G01R 1/06
[52] U.S. Cl. .................... 324/158 F; 324/158 P
[58] Field of Search ........... 324/158 F, 158 P, 73 PC, 324/73.1

[56] References Cited

U.S. PATENT DOCUMENTS

| | | | |
|---|---|---|---|
| 4,713,611 | 12/1987 | Solstad et al. | 324/158 F |
| 4,749,945 | 6/1988 | Bonifert et al. | 324/158 F |
| 4,757,255 | 7/1988 | Margozzi | 324/158 F |

FOREIGN PATENT DOCUMENTS

| | | | |
|---|---|---|---|
| 0148436 | 11/1980 | Japan | 324/158 F |
| 0023869 | 2/1982 | Japan | 324/158 F |

Primary Examiner—Ernest F. Karlsen
Attorney, Agent, or Firm—Stan Protigal; Angus C. Fox; Jon Busack

[57] ABSTRACT

A two-piece burn-in board is used in semiconductor testing. The board can be disassembled so that it has ability to act as a device carrier wherein each individual device is completely isolated and as a standard burn-in board wherein all devices share the common signals. This ability to isolate or combine signals makes the board useable for functional device test/characterization and burn-in.

27 Claims, 4 Drawing Sheets

BURN-IN BOARD HAVING DISCRETE TEST CAPABILITY

FIELD OF THE INVENTION

This invention relates to test and manufacturing equipment for semiconductor devices and to mounting and circuit connections for producing circuit boards. More specifically, the invention relates to mounting boards whereby an array of semiconductor devices can be mounted for environmental burn-in, and later transferred to a testing station and tested.

BACKGROUND OF THE INVENTION

Semiconductor devices use various materials which are electrically either conductive, insulative, or semiconductive. These form a semiconductor device, often referred to as a "semiconductor". This reference will be used throughout this disclosure.

In the manufacture of semiconductors, a circuit is applied to a wafer, usually in a repeat fashion across the surface of the wafer. The circuits are tested or "probed" while the wafer is in a single piece and then the wafer is cut into individual pieces called "dice" using diamond saws. Each cut die is then mounted onto a lead frame and connected to the lead frame. This assembly is then encapsulated with a plastic molding compound resulting in a single packaged unit. At that point, a series of electrical tests of the completed circuits are made.

These tests include initial circuit testing, a burn-in test, and a final circuit testing. The burn-in test is a combined procedure in which the circuits are placed under environmental stress and exercised in these environmental stress conditions. In one system, 256 circuits are connected in an arrangement of parallel connections and the circuits are exercised in heated chambers, using common inputs and a matrix arrangement of output connections. In the units for which this invention was developed, the chambers are brought up to 1250 celsius and are exercised for up to 168 hours.

In this type of testing, individual semiconductors can not be tested at their maximum speeds and other discrete testing cannot be accomplished. For this reason, after burn-in, the semiconductors are removed and placed into tubes. The tubes are then loaded into further testing machines which are used to perform further tests on the semiconductors. This further handling involves machinery that must be adapted to handle the semiconductors in the tubes in an efficient manner. Furthermore, the semiconductors in the tubes must be tracked in an accounting system in order that the results of the tests may be associated with the particular unit under test.

Therefore, the current device handlers require "tube-to-tube" transport, wherein each device must be singulated into a test site where functional testing is done. This requires different types of test handlers for different types of semiconductor packages. It is therefore, desirable to greatly enhance semiconductor test efficiency and to reduce capital expenditures by eliminating the need for device handlers dedicated to a particular package type during final testing. It is further desirable to provide a universal design for test equipment which performs testing of semiconductor devices, with portions of the burn-in carrier assemblies in configurations specific to semiconductor package types.

SUMMARY OF INVENTION

The present invention is directed to a two-piece burn-in board which has an ability to act as a standard burn-in board, in which all devices on the board share common signals. The burn-in board consists of two boards, a first of which includes discrete signal traces connected to device sockets. This board acts as a "carrier" that will be used for further discrete testing. A second board is overlayed by the first board and connects the circuit traces into parallel connections in a manner acceptable for burn-in and burn-in testing. The second board is removable from the first board and may be replaced with a discrete or semi-discrete test board, through which discrete testing can be accomplished.

DETAILED DESCRIPTION OF THE PREFERRED EMBODIMENTS

Figure 1:
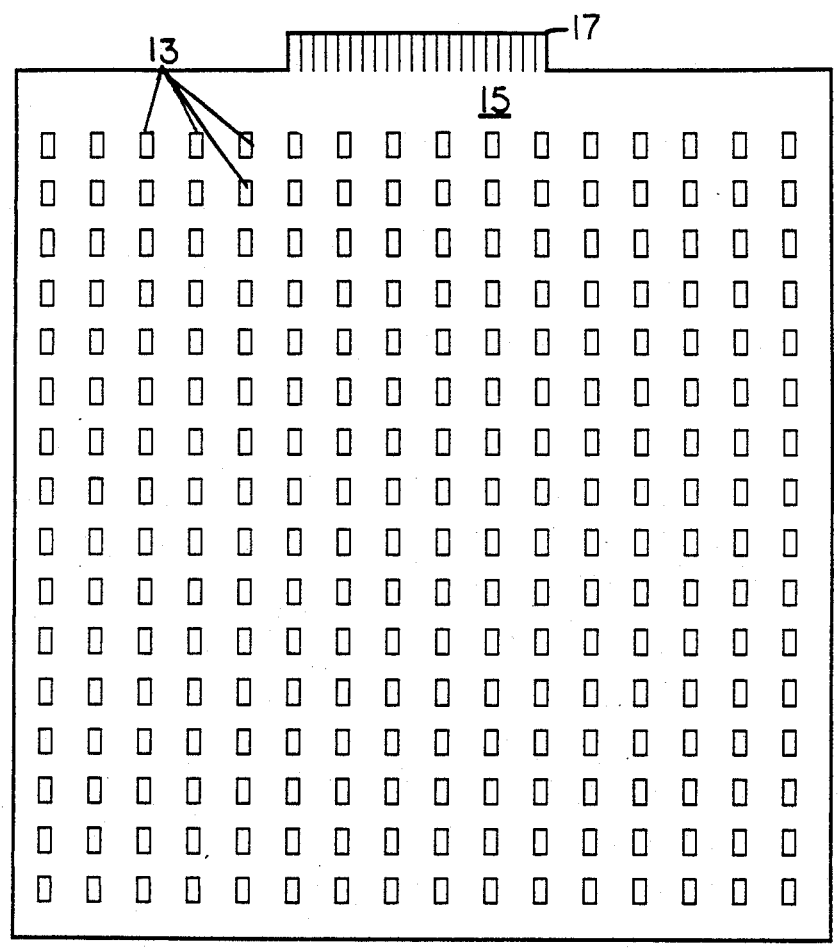
FIG. 1 shows a prior art burn-in board, wherein a series of device sockets are arranged with parallel connections, using an edge connector.

FIG. 1 shows a prior art burn-in and test board 11, in which an array of sockets 13 are mounted to a multilayer printed circuit board 15. The sockets 13 may be configured to accept any of a variety of chip packages. Typically, the boards have 16 rows by 16 columns of sockets.

In order to economize on circuit connections during the burn-in process, the 256 chips are, at least in part, connected in parallel. This is appropriate for the burn-in procedure because discrete operations of the semiconductors is not necessary in order to exercise the semiconductors during the stress conditions.

The sockets 13 have their output connections arranged by banks so that it is possible to read this matrix to detect individual failed semiconductors. Such matrix testing is not complete in that some failure modes do not readily appear in the test results. Furthermore, while it is possible to group the chips in accordance with speed grades so that a single speed grade could appear on a single test board 11, discrete testing is necessary in order to test the individual semiconductors at their maximum speeds. In order to connect all the sockets 13 to an edge connector 17 on the board 11, each terminal on each socket 13 must have an individual circuit trace which eventually is connected to an appropriate terminal on the edge connector 17. The circuit traces, are of course, routed to other circuit traces in order to achieve the parallel connection. This also allows a manageable number of terminals to be placed on the edge connector 17 in order that the board 11 be conveniently placed into an environmental chamber 19, shown in FIG. 2.

Figure 2:
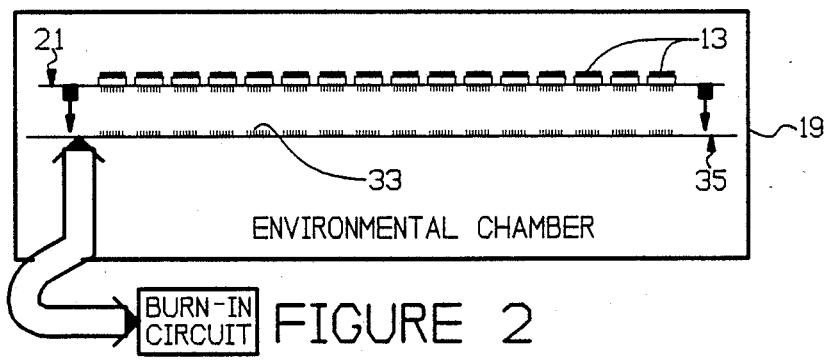
FIGS. 2 and 3 show side and plan views of a device carrier board constructed in accordance with the present invention.
Figure 3:
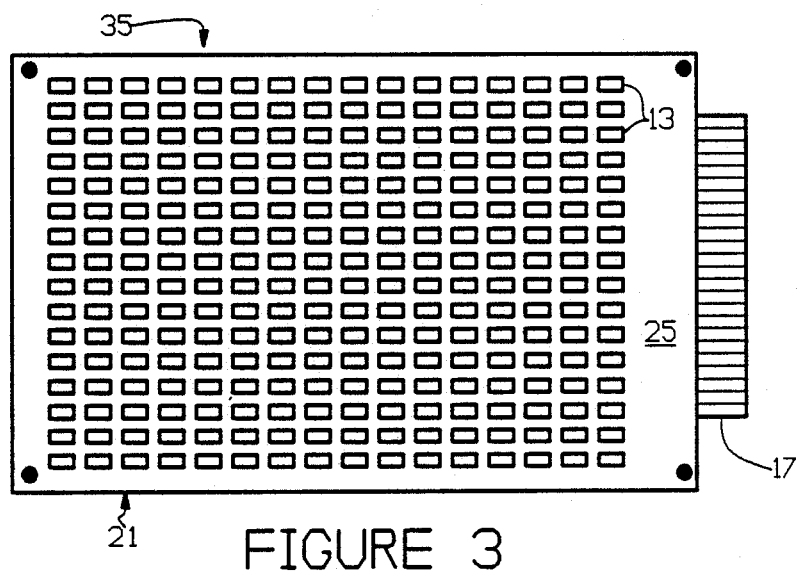

Referring to FIG. 2, in accordance with the preferred embodiment of the invention, a carrier board 21 includes the sockets 13 arranged on a printed circuit socket board 25. The sockets 13 can be any of a number of varieties, such as dual in-line (DIP) packages, zig-zag in line packaging (ZIP), small outline j-leaded packaging (SOJ), single in-line high density packaging (SIP) and other configurations.

The carrier board 25 includes a plurality of through holes (not shown), thereby accepting electrical connections 29 to the sockets 13. Elastomeric contacts 31 preferably connect the through holes 29 to a plurality of pads 33 on a signal trace board 35, shown in FIGS. 2-5. The contacts 31 may be organic elastomer pads, as in the preferred embodiment, or they may be metal spring contacts or any suitable contact which allows the carrier board to establish contact with the signal trace board 35. Likewise, the contacts 31 may be either on the signal trace board 35 or on the carrier board 25, although it would appear preferable to have the contacts 31 be on the signal trace board 35 because of ease of manufacture and the relative costs involved in replacing damaged boards of either type.

Figure 4:
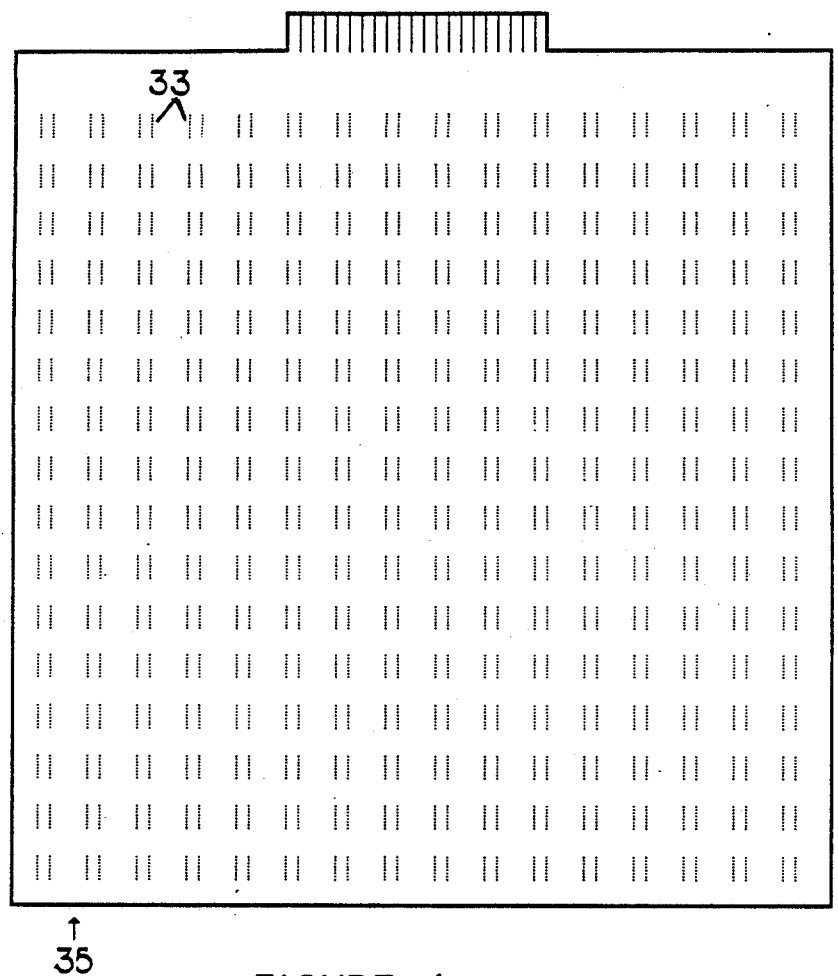
FIG. 4 shows a plan view of signal trace board used to connect the carrier board to a burn-in test unit.
Figure 5:
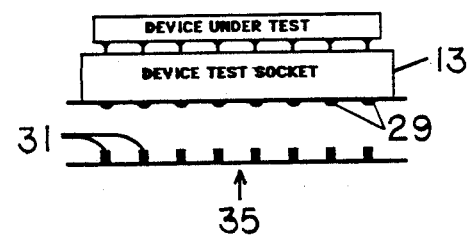
FIG. 5 shows details of the relationships of the device, the carrier board and the carrier board to a burn-in test unit.

These pads 33 correspond to a series of circuit traces on a signal trace board 35, shown in FIG. 4. The signal trace board 35 meets with the socket carrier board 25 and connects the pins of the sockets 13 (through the pads 33) to an edge connector 17'. In other words, the signal trace board 35 is similar to the prior art circuit board 15, but, instead of mounting sockets 13, the signal trace board 35 merely meets with the pads 33 of the chip carrier board 15 and mounts the chip carrier board 21. Of course, without the sockets, the signal trace board 35 may be easier to construct.

In order that semiconductors may be put through the burn-in and burn-in test procedure, the semiconductors are placed in the sockets 13 of the chip carrier board 21. A chip carrier board 21 is mounted to the signal trace board 35 and the mounted boards are inserted into the burn-in chamber in a manner similar to the prior art insertion of the burn-in and test board 11.

The two-piece burn-in board which has an ability to act as a standard burn-in board, in which all devices on the board share common signals. The chip carrier board 21 is the first board, and includes discrete signal traces connected to the device sockets 13, and acts as a "carrier" that will be used for further discrete testing. The signal trace board 35 is overlaid by the first board 21 and connects the socketed devices for parallel connections in a manner acceptable for burn-in and burn-in testing.

The second board is removable from the first board and may be replaced with a discrete or semi-discrete test board, through which discrete testing can be accomplished.

In the prior art, after the burn-in and test procedure, the semiconductors would be removed from the prior art board 11 and tubed (put in tubes) for subsequent testing. In accordance with the present invention, the semiconductors are not removed from the sockets 13, but instead, the chip carrier board 21 is removed from the signal trace board 35.

Figure 6:
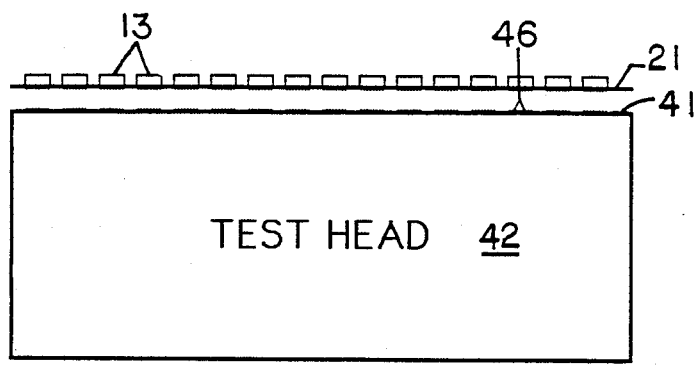
FIG. 6 shows the carrier board of FIGS. 2–3 being mounted to a discrete test head.
Figure 7:
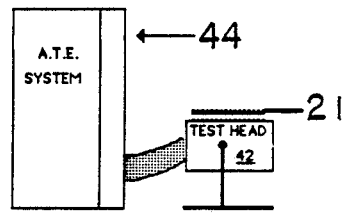
FIG. 7 is a representation of the use of the invention for discrete circuit testing.
Figure 8:
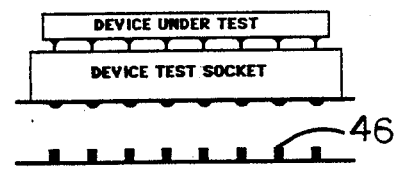
FIG. 8 shows details of the relationships of the device, the carrier board and the test head.

Referring to FIGS. 6-8, the chip carrier board 21 is connected to a test head 42 which is part of automated test equipment 44 to provide discrete connections for individual device testing. As shown on FIGS. 6 and 8, the test head 42 has a plurality of pins 46 which meet with the signal trace board 35 to connect the sockets 13 in a manner similar to the pads 33 (FIG. 2) connecting with the sockets 13 on the circuit trace board 35. While the circuit traces are described as being discrete, it is understood that there are some connections, such as a ground connection, which can be connected in parallel without affecting the test procedures.

The above description is directed to a specific embodiment of the invention and is not meant to imply that variations on the preferred embodiment are not possible. For example, it is possible to provide for variations in the burn-in and test procedure by providing different types of connections on the device carrier board 3 used in the burn-in procedure. It is possible to use a variety of contact designs for connecting the carrier board 21 with signal trace board 35 or test head 42. For example, a discrete circuit trace board, which would appear similar to board 35 of FIG. 4, may be used to connect the device carrier board 35. It is further possible for the signal trace board 35 and the test head 42 to directly contact terminations on the devices under test which are retained in appropriate positions by the sockets 13. Such contact would be facilitated by the use of elastomeric connectors on the signal trace board 35 and on the test head.

It is possible to provide arrangements where the chip carrier board 21 is mounted to the signal trace boards from either the top or the bottom of the chip carrier board 21 (as viewed from the sockets 13). It is also contemplated that the discrete testing may be accomplished by placing the chip carrier board onto a bed of nails tester, either directly or through the discrete signal trace board 41. Therefore, the invention should be read as limited only by the appended claims.

I claim:

1. Test equipment for exercising and performing multiple tests on a plurality of semiconductor devices characterized by:

(a) a first printed circuit board including an array of semiconductor device-receiving sockets thereon for receiving packaged semiconductor circuit parts, the sockets each containing a plurality of electrical contact terminals, the terminals being in electrical communication with respective electrical connections on the semiconductor devices when the semiconductor devices are installed in the sockets;

(b) a second circuit board adapted to be mounted in a planarly parallel configuration to the first printed circuit board, the second printed circuit board having a plurality of circuit traces thereon, the mounted boards being insertable into an environmental burn-in chamber;

(c) a plurality of electrical contacts on one side of said second printed circuit board, said electrical contacts being in electrical communication with respective ones of the electrical contact terminals when the second circuit board is mounted to the first printed circuit board, said mounting placing the second printed circuit to meet with the first printed circuit board, and connecting the plurality of electrical contact terminals on the first printed circuit board with the plurality of circuit traces on the second printed circuit board;

(d) an environmental chamber with a burn-in circuit;

(e) a connector on the second circuit board for connection to a burn-in circuit when the mounted boards are inserted into the environmental burn-in chamber, a plurality of said electrical contact terminals connected in parallel to the connector;

(f) the circuit traces being arranged to electrically communicate with ones of the contacts on the first board and with the connector; and (g) a discrete circuit tester adapted to receive the first board, the first board being removable from the second circuit board and being mountable onto the discrete circuit tester.

2. Test equipment as described in claim 1, further characterized by:

the second board providing parallel connections to a plurality of the contacts in a manner which permits testing groups of semiconductor devices in a matrix.

3. Test equipment as described in claim 2, further characterized by:

the second board including a plurality of contacts which mate with ones of the plurality of contacts on the first printed circuit board.

4. Test equipment as described in claim 3, further characterized by:

said plurality of contacts being elastomeric contacts.

5. Test equipment as described in claim 3, further characterized by:

said plurality of contacts being resilient metal contacts.

6. Test equipment as described in claim 2, further characterized by:

the first board including a plurality of contacts which mate with ones of the plurality of contacts on the first printed circuit board.

7. Test equipment as described in claim 6, further characterized by:

said plurality of contacts being elastomeric contacts.

8. Test equipment as described in claim 6, further characterized by:

said plurality of contacts being resilient metal contacts.

9. Test equipment as described in claim 6, further characterized by:

(a) a discrete testing circuit test board including a plurality of circuit traces which include a plurality of discrete circuit traces;

(b) the discrete testing circuit test board being mountable t the chip carrier board; and (c) the discrete testing circuit test board including a connector for connection to the discrete circuit tester.

10. A chip carrier board assembly for performing burn-in tests of semiconductor devices, in which a plurality of sockets are arranged in a plurality of rows and a plurality of columns, and having circuit connections from the sockets to a connector, which enable the assembly to be installed into an environmental chamber and the semiconductor devices to be exercised by a burn-in circuit while in the sockets when the board is in the environmental chamber, characterized by:

(a) a first printed circuit board including the plurality of sockets thereon in the rows and columns, the sockets receiving packaged semiconductor circuit parts;

(b) a second circuit board adapted to be mounted in a planarly parallel configuration to the first printed circuit board, the second printed circuit board having a plurality of circuit traces thereon, the mounted boards being insertable into an environmental burn-in chamber;

(c) a plurality of electrical contacts on one side of said second printed circuit board, said electrical contacts being in electrical communication with respective ones of electrical terminations on circuit devices in the sockets when said boards are mounted, said mounting placing the second printed circuit to meet with the first printed circuit board, and connecting the plurality of electrical contact terminals on the first printed circuit board with the plurality of circuit traces on the second printed circuit board, and at least some of the contacts being in discrete communication with individual ones of the electrical contact terminals;

(d) the second circuit board having a connector thereon for connection to the burn-in circuit when the mounted boards are inserted into the environmental burn-in chamber, a plurality of said electrical contact terminals connected in parallel to the connector;

(e) the circuit traces being arranged to electrically communicate with ones of the contacts on the first board and with the connector;

(f) a test head connected to a discrete circuit tester; and (g) the first board being mountable onto the test head, when the second circuit board is not mounted to the first circuit board, the test head providing discrete connections for individual device testing.

11. Test equipment as described in claim 10, further characterized by:

the second board providing parallel connections to a plurality of the contacts.

12. Test equipment as described in claim 11, further characterized by:

the second board including a plurality of contacts which mate with ones of the plurality of contacts on the first printed circuit board 13. Test equipment as described in claim 12, further characterized by:

said plurality of contacts being elastomeric contacts.

14. Test equipment as described in claim 12, further characterized by:

said plurality of contacts being resilient metal contacts.

15. Test equipment as described in claim 11, further characterized by:

the second board including a plurality of contacts which mate with ones of the plurality of contacts on the first printed circuit board.

16. Test equipment as described in claim 15, further characterized by:

said plurality of contacts being elastomeric contacts.

17. Test equipment as described in claim 15, further characterized by:

said plurality of contacts being resilient metal contacts.

18. Test equipment for exercising and performing multiple tests on a plurality of semiconductor devices characterized by:

(a) an environmental test chamber adapted to receive a plurality of printed circuit boards therein;

(b) a burn-in circuit having electrical connections for exercising circuitry on the printed circuit boards within the environmental test chamber;

(c) a first printed circuit board including an array of semiconductor device-receiving sockets thereon for receiving packaged semiconductor circuit parts, the sockets each containing a plurality of electrical contact terminals, the terminals being in electrical communication with respective electrical connections on the semiconductor devices when the semiconductor devices are installed in the sockets;

(d) a plurality of electrical contacts on one side of the first printed circuit board, said contacts being in electrical communication with respective ones of the electrical contact terminals, and at least some of said communication being discrete communication with individual ones of the electrical contact terminals;

(e) a second circuit board adapted to be mounted in a planarly parallel configuration to the first printed circuit board and to be received by the environmental test chamber, the mounted boards being insertable into an environmental burn-in chamber, said mounting placing the second printed circuit to meet with the first printed circuit boards, and connecting the plurality of electrical contact terminals on the first printed circuit board with the plurality of circuit traces on the second printed circuit board;

(f) a connector on the second circuit board for connection within the environmental test chamber to the burn-in circuit when the mounted boards are inserted into the environmental burn-in chamber;

(g) the second printed circuit board having a plurality of circuit traces thereon;

(h) the circuit traces being arranged to electrically communicate with ones of the contacts on the first board and with the connector; and (i) a discrete circuit tester having a test head which is capable of receiving the first circuit board; and (j) the first board being mountable onto the test head when the second circuit board is not mounted to the first circuit board and the discrete circuit tester electrically communicating with ones of the electrical contact terminals through the test head when the first board is mounted onto the discrete circuit tester.

19. Test equipment as described in claim 18, further characterized by:
the second board providing parallel connections to a plurality of the contacts.

20. Test equipment as described in claim 19, further characterized by:
the second board including a plurality of contacts which mate with ones of the plurality of contacts on the first printed circuit board.

21. Test equipment as described in claim 20, further characterized by:
said plurality of contacts being elastomeric contacts.

22. Test equipment as described in claim 20, further characterized by:
said plurality of contacts being resilient metal contacts.

23. Test equipment as described in claim 19, further characterized by:
the second board including a plurality of contacts which mate with ones of the plurality of contacts on the first printed circuit board.

24. Test equipment as described in claim 23, further characterized by:
said plurality of contacts being elastomeric contacts.

25. Test equipment as described in claim 23, further characterized by:
said plurality of contacts being resilient metal contacts.

26. Test equipment as described in claim 23, further characterized by:
(a) a discrete testing circuit test board including a plurality of circuit traces which include a plurality of discrete circuit traces;
(b) the discrete testing circuit test board being mountable to the chip carrier board; and
(c) the discrete testing circuit test board including a connector for connection to the discrete circuit tester.

27. Test equipment as described in claim 19, further characterized by:
the first board including a plurality of contacts which mate with ones of the plurality of contacts on the second printed circuit board.

* * * * *

UNITED STATES PATENT AND TRADEMARK OFFICE
CERTIFICATE OF CORRECTION

PATENT NO. : 4,926,117
DATED : May 15, 1990
INVENTOR(S) : Leland R. Nevill

It is certified that error appears in the above-indentified patent and that said Letters Patent is hereby corrected as shown below:

Column 4, line 12, delete "3" and insert -- 35 --.

Signed and Sealed this

Twenty-third Day of November, 1993

Attest:

BRUCE LEHMAN

*Attesting Officer*          *Commissioner of Patents and Trademarks*